United States Patent
Pendharkar

(10) Patent No.: US 8,217,453 B2
(45) Date of Patent: Jul. 10, 2012

(54) BI-DIRECTIONAL DMOS WITH COMMON DRAIN

(75) Inventor: Sameer P. Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 356 days.

(21) Appl. No.: 12/537,329

(22) Filed: Aug. 7, 2009

(65) Prior Publication Data

US 2010/0032757 A1     Feb. 11, 2010

Related U.S. Application Data

(60) Provisional application No. 61/086,933, filed on Aug. 7, 2008.

(51) Int. Cl.
*H01L 27/06* (2006.01)
*H01L 21/8234* (2006.01)

(52) U.S. Cl. ........ 257/337; 438/237; 438/275; 438/287; 257/E27.016; 257/E21.616; 257/E21.625; 257/124

(58) Field of Classification Search ............... 257/337, 257/124, E27.016, E21.616, E21.625; 438/237, 438/275, 287
See application file for complete search history.

(56) References Cited

U.S. PATENT DOCUMENTS

| | | | |
|---|---|---|---|
| 2007/0114608 A1* | 5/2007 | Letavic | 257/347 |
| 2009/0159968 A1* | 6/2009 | Merchant et al. | 257/337 |
| 2009/0283827 A1* | 11/2009 | Pendharkar et al. | 257/343 |
| 2009/0286371 A1* | 11/2009 | Pendharkar et al. | 438/270 |
| 2009/0294841 A1* | 12/2009 | Pendharkar et al. | 257/328 |
| 2010/0032774 A1* | 2/2010 | Burgess et al. | 257/408 |
| 2010/0117150 A1* | 5/2010 | Pendharkar et al. | 257/337 |
| 2011/0186933 A1* | 8/2011 | Pendharkar et al. | 257/368 |

* cited by examiner

*Primary Examiner* — Alexander O. Williams
(74) *Attorney, Agent, or Firm* — Alan A. R. Cooper; Wade James Brady, III; Frederick J. Telecky, Jr.

(57) ABSTRACT

A three terminal bi-directional laterally diffused metal oxide semiconductor (LDMOS) transistor which includes two uni-directional LDMOS transistors in series sharing a common drain node, and configured such that source nodes of the uni-directional LDMOS transistors serve as source and drain terminals of the bi-directional LDMOS transistor. The source is shorted to the backgate of each LDMOS transistor. The gate node of each LDMOS transistor is clamped to its respective source node to prevent source-gate breakdown, and the gate terminal of the bi-directional LDMOS transistor is connected to the gate nodes of the constituent uni-directional LDMOS transistors through blocking diodes. The common drain is a deep n-well which isolates the two p-type backgate regions. The gate node clamp can be a pair of back-to-back zener diodes, or a pair of self biased MOS transistors connected source-to-source in series.

20 Claims, 7 Drawing Sheets

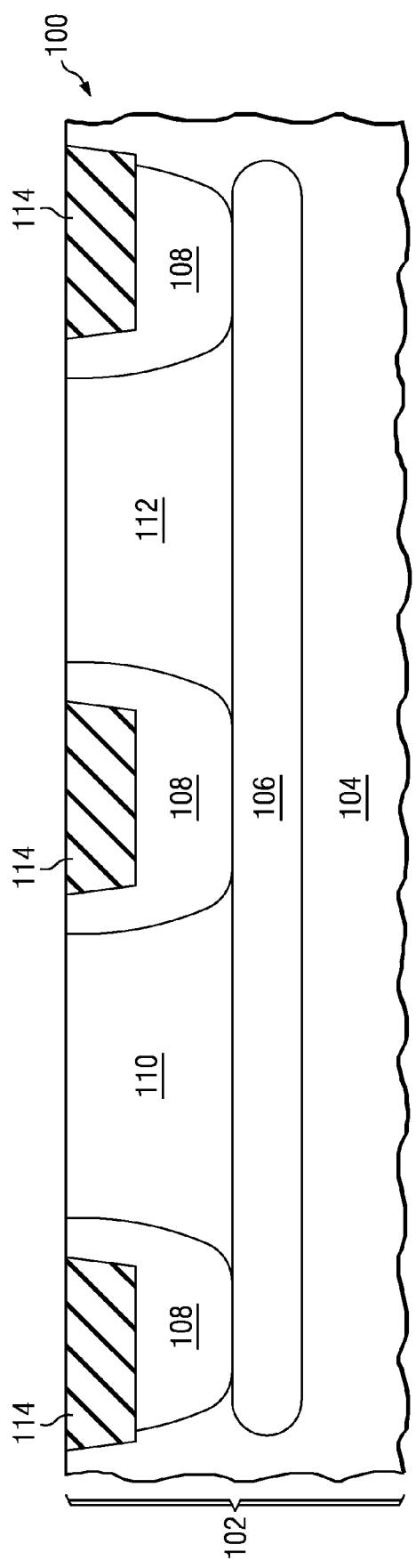
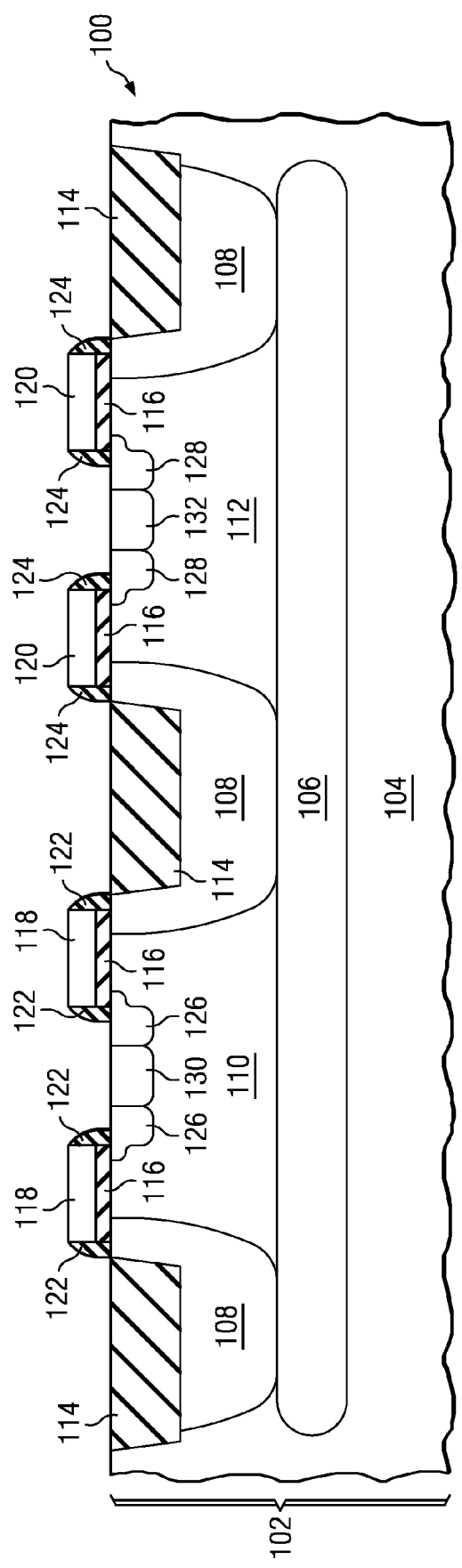

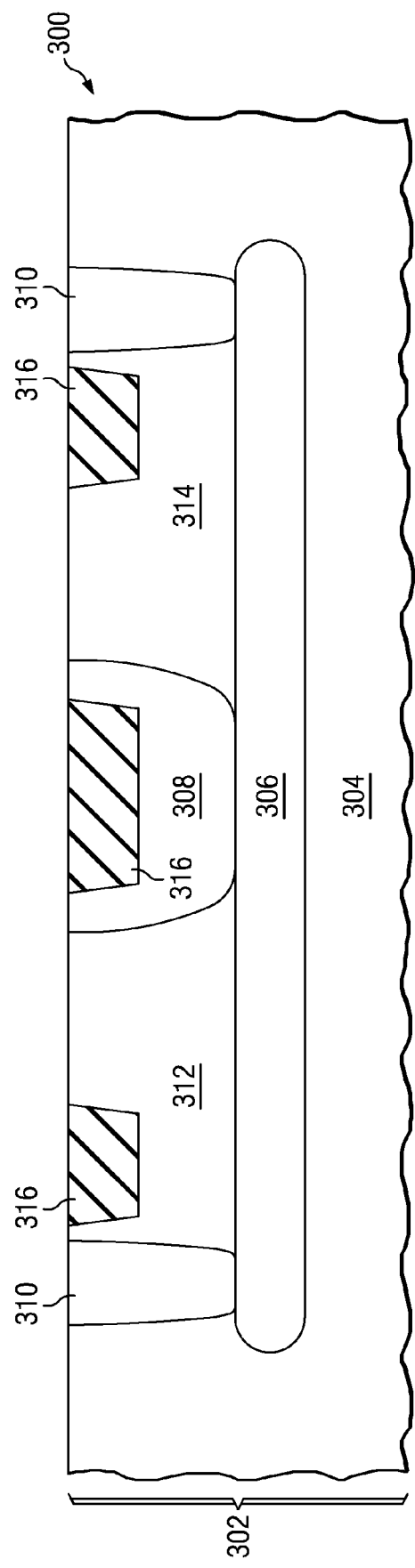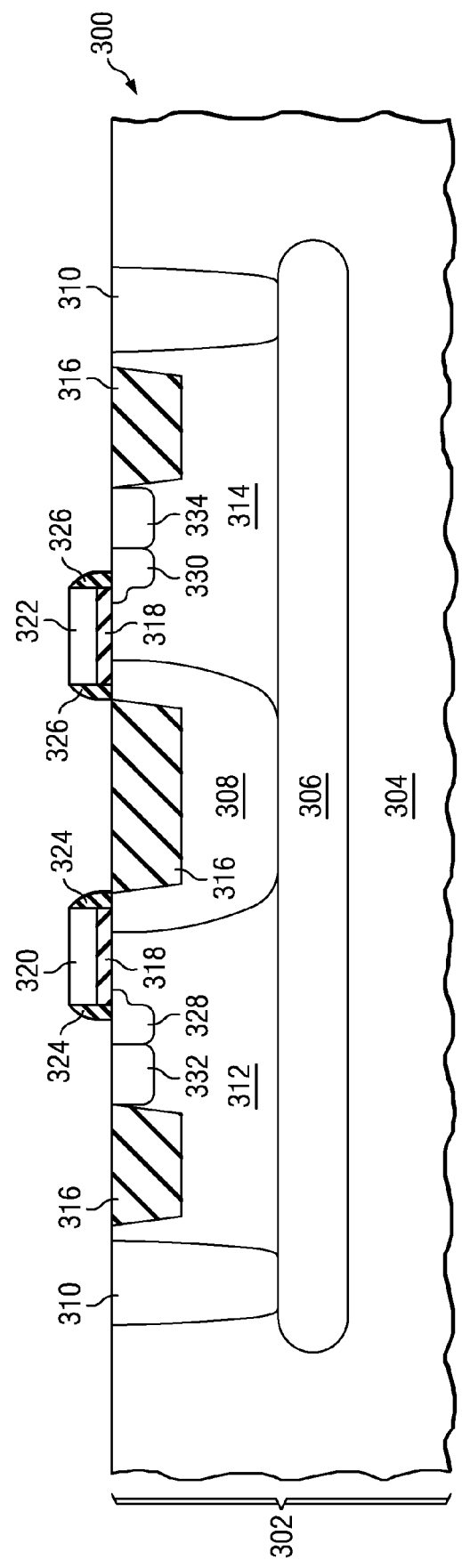

BI-DIRECTIONAL DMOS WITH COMMON DRAIN

FIELD OF THE INVENTION

This invention relates to the field of integrated circuits. More particularly, this invention relates to high voltage transistors in integrated circuits.

BACKGROUND OF THE INVENTION

Lateral diffused metal oxide semiconductor (LDMOS) transistors and drain extended metal oxide semiconductor (DEMOS) transistors in integrated circuits (ICs) provide a desirable capability of modulating voltages which exceed breakdown limits of gate dielectrics in the LDMOS and DEMOS transistors. LDMOS and DEMOS transistors are uni-directional devices, in which voltages exceeding the breakdown limits of the gate dielectrics must be applied to the drain nodes, but not the source nodes. Bi-directional configurations of high voltage transistors, in which source and drain roles may be reversed, exhibit increased series resistance or require thick gate dielectric layers which are problematic to integrate into IC fabrication processes.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a three terminal bi-directional laterally diffused metal oxide semiconductor (LDMOS) transistor which includes two uni-directional LDMOS transistors sharing a common drain node, configured such that source nodes of the uni-directional LDMOS transistors serve as source and drain terminals of the inventive bi-directional LDMOS transistor, and in which a source node and a backgate node of each LDMOS transistor are electrically connected, a gate node of each LDMOS transistor is clamped to its respective source node, and a gate terminal of the bi-directional LDMOS transistor is connected to the gate nodes of the constituent uni-directional LDMOS transistors through blocking diodes.

An advantage of the bi-directional LDMOS transistor is its lower series resistance compared to a functionally equivalent configuration using two separate unidirectional LDMOS transistors. A further advantage is the bi-directional LDMOS transistor may be integrated into complementary metal oxide semiconductor (CMOS) and bipolar CMOS (BiCMOS) ICs without adding fabrication cost or complexity.

DESCRIPTION OF THE VIEWS OF THE DRAWING

FIG. 1A through FIG. 1C are cross-sections of a first embodiment of the instant invention depicted in successive stages of fabrication.

FIG. 3A through FIG. 3C are cross-sections of a third embodiment of the instant invention depicted in successive stages of fabrication.

DETAILED DESCRIPTION

Figure 1C:
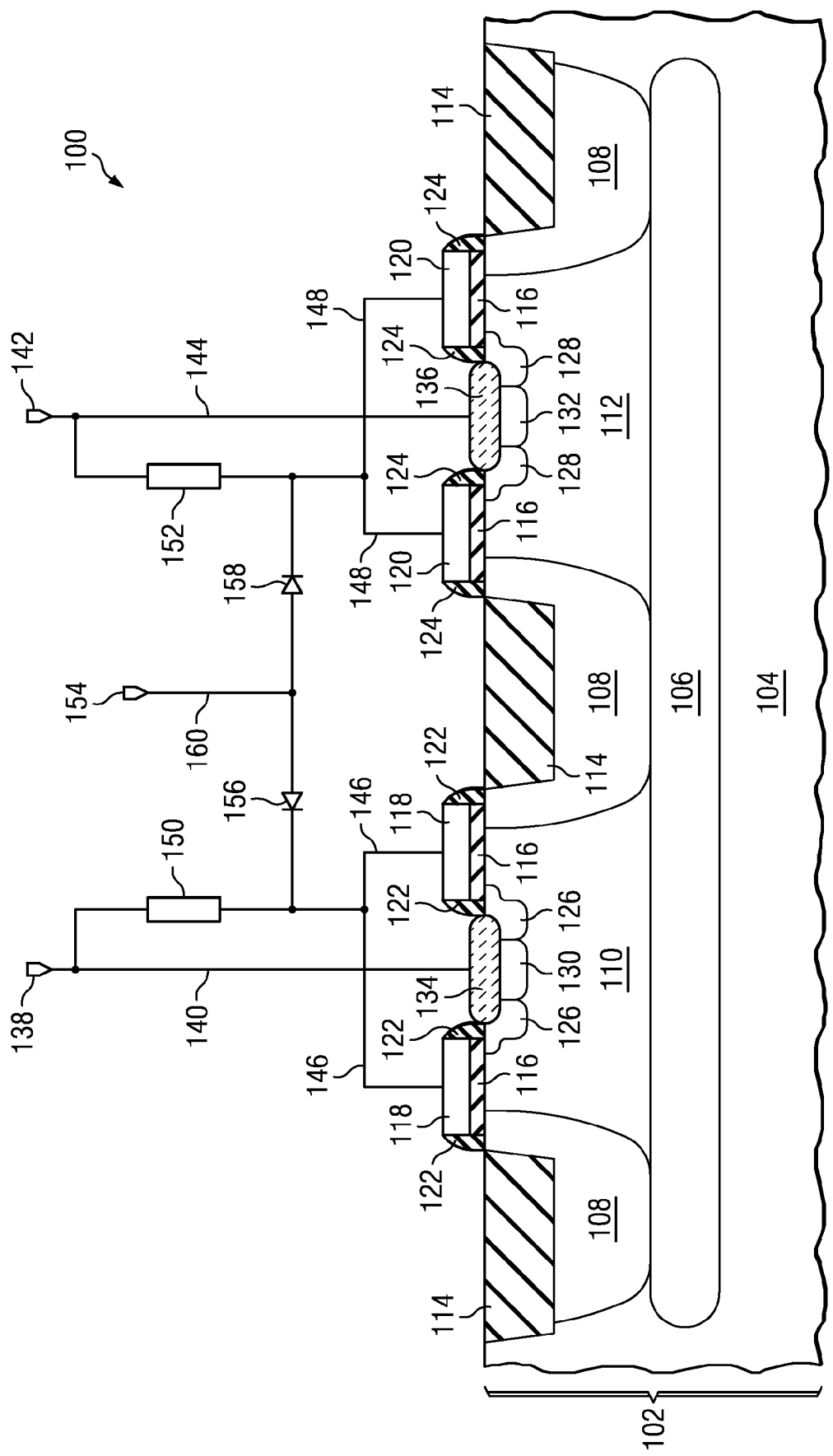

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The instant invention provides a three terminal bi-directional laterally diffused metal oxide semiconductor (LDMOS) transistor in an integrated circuit (IC) in which two uni-directional LDMOS transistors are configured in series, sharing a common diffused drain node. Source nodes of the two uni-directional LDMOS transistors serve as source and drain terminals of the inventive bi-directional LDMOS transistor. In each uni-directional LDMOS transistor, the source node and a backgate node of each LDMOS transistor are directly electrically connected. A gate node of each LDMOS transistor is clamped to its respective source node to maintain a source-gate voltage below a breakdown limit. A gate terminal of the bi-directional LDMOS transistor is connected to the each gate node of the constituent uni-directional LDMOS transistors through blocking diodes.

The bi-directional LDMOS transistor achieves bi-directionality by shunting an applied drain potential to the shared drain node of the constituent uni-directional LDMOS transistors. The uni-directional LDMOS transistor on the source side of the bi-directional LDMOS transistor modulates the applied drain potential based on an applied gate potential to the bi-directional LDMOS transistor which is transferred through the blocking diode to the gate node of the source-side uni-directional LDMOS transistor. A series resistance of the bi-directional LDMOS transistor is substantially equal to a combined series resistance of the constituent uni-directional LDMOS transistors.

An advantage of the instant invention is the bi-directional LDMOS transistor may be integrated into complementary metal oxide semiconductor (CMOS) and bipolar CMOS (BiCMOS) ICs without adding fabrication cost or complexity.

FIG. 1A through FIG. 1C are cross-sections of a first embodiment of the instant invention depicted in successive stages of fabrication. Referring to FIG. 1A, an IC 100 is formed in a substrate 102, typically p-type single crystal silicon, but possibly a silicon-on-insulator (SOI) wafer, a hybrid orientation technology (HOT) wafer, or any other substrate appropriate for supporting the fabrication of the IC

100. Substrate material 104 near a top surface of the substrate 102 is p-type. An n-type buried layer (NBL) 106 is formed in the substrate in an area defined for the bi-directional LDMOS transistor using known methods, typically including ion implanting an NBL set of n-type dopants, commonly antimony, and possibly arsenic and/or phosphorus, at a total dose between $1 \cdot 10^{15}$ and $1 \cdot 10^{16}$ cm$^{-2}$, into a top region of the substrate 102 followed by epitaxial growth of 2 to 5 microns of p-type semiconductor material on a top surface of the substrate 102 and NBL 106.

Still referring to FIG. 1A, a deep n-well 108 is formed in the substrate 102 extending from the top surface of the substrate 102 to the NBL 106. The deep n-well 108 is formed by ion implanting a deep n-well set of n-type dopants, commonly phosphorus, and possibly arsenic, typically at a total dose between $1 \cdot 10^{15}$ and $3 \cdot 10^{16}$ cm$^{-2}$, into areas in the substrate 102 defined for the deep n-well, followed by a diffusion operation which heats the IC 100 to diffuse and electrically activate a portion of the deep n-well set of n-type dopants. The deep n-well 108 surrounds and isolates a first p-type backgate region 110 and a second p-type backgate region 112 from the p-type substrate material 106.

Continuing to refer to FIG. 1A, optional elements of field oxide 114 are formed by a shallow trench isolation (STI) process sequence, in which trenches, commonly 200 to 500 nanometers deep, are etched into the substrate 102, electrically passivated, commonly by growing a thermal oxide layer on sidewalls of the trenches, and filled with insulating material, typically silicon dioxide, commonly by a high density plasma (HDP) process or an ozone based thermal chemical vapor deposition (CVD) process, also known as the high aspect ratio process (HARP).

FIG. 1B depicts the IC 100 at a subsequent stage of fabrication. A gate dielectric layer 116, typically silicon dioxide, nitrogen doped silicon dioxide, silicon oxy-nitride, hafnium oxide, layers of silicon dioxide and silicon nitride, or other insulating material, between 1.5 and 5 nanometers thick, is formed on top surfaces of the deep n-well 108, first p-type backgate region 110 and second p-type backgate region 112. A first set of LDMOS gates 118 is formed on a top surface of the gate dielectric layer 116 overlapping the deep n-well 108 and the first p-type backgate region 110. A second set of LDMOS gates 120 is formed on the top surface of the gate dielectric layer 116 overlapping the deep n-well 108 and the second p-type backgate region 112. The LDMOS gates 118, 120 are formed using known methods, such as depositing a layer of polycrystalline silicon, commonly known as polysilicon, on the top surface of the gate dielectric layer 116, generating a gate photoresist pattern on a top surface of the polysilicon layer to define gate areas, and removing unwanted polysilicon using known etch methods. It is common to form the LDMOS gates 118, 120 concurrently with n-channel metal oxide semiconductor (NMOS) transistor gates and p-channel metal oxide semiconductor (PMOS) transistor gates in the IC 100.

Continuing to refer to FIG. 1B, a set of n-type lightly doped drain (NLDD) set of n-type dopants is ion implanted into a top region of the first p-type backgate region 110 adjacent to the first set of LDMOS gates 118 and into a top region of the second p-type backgate region 112 adjacent to the second set of LDMOS gates 120, using common NLDD process parameters, such as implanting phosphorus and/or arsenic at a total dose between $3 \cdot 10^{14}$ and $3 \cdot 10^{15}$ cm$^{-2}$, to depths between 2 and 50 nanometers. It is common to ion implant the NLDD set of dopants concurrently in NMOS transistors in the IC 100.

Continuing to refer to FIG. 1B, a first set of gate sidewall spacers 122 is formed on lateral surfaces of the first set of LDMOS gates 118, using known methods, such as depositing of one or more conformal layers of silicon nitride and/or silicon dioxide on a top and lateral surfaces of the first set of LDMOS gates 118, followed by removing the conformal layer material from the top surface of the first set of LDMOS gates 118 by known anisotropic etching methods, leaving the conformal layer material on the lateral surfaces of the first set of NMOS gate 118. A second set of gate sidewall spacers 124 is formed on lateral surfaces of the second set of LDMOS gates 120 in a similar manner. It is common to form the first set of gate sidewall spacers 122 and the second set of gate sidewall spacers 124 concurrently with gate sidewall spacers on NMOS and PMOS transistors in the IC 100.

Continuing to refer to FIG. 1B, an n-type source and drain (NSD) set of n-type dopants is ion implanted into the top region of the first p-type backgate region 110 adjacent to the first set of gate sidewall spacers 122 and into a top region of the second p-type backgate region 112 adjacent to the second set of gate sidewall spacers 124, using common NSD process parameters, such as implanting phosphorus and arsenic at a total dose between $1 \cdot 10^{15}$ and $1 \cdot 10^{16}$ cm$^{-2}$, to depths between 10 and 100 nanometers. The NSD implanted regions overlap the NLDD implanted regions. It is common to ion implant the NSD set of dopants concurrently in NMOS transistors in the IC 100.

Continuing to refer to FIG. 1B, a p-type tap set of p-type dopants is ion implanted into the top region of the first p-type backgate region 110 between the NSD implanted regions and into the top region of the second p-type backgate region 112 between the NSD implanted regions, using common n-type tap process parameters, such as implanting boron, a portion of which may be in the form $BF_2$, at a total dose between $1 \cdot 10^{15}$ and $1 \cdot 10^{16}$ cm$^{-2}$, to depths between 10 and 100 nanometers. It is common to ion implant the p-type tap set of dopants concurrently in p-type source and drain (PSD) regions in PMOS transistors in the IC 100.

Continuing to refer to FIG. 1B, an anneal operation is performed on the IC 100 which activates a portion of the NLDD set of dopants, a portion of the NSD set of dopants and a portion of the p-type tap set of dopants to form a first set of LDMOS source regions 126 in the first p-type backgate region 110 adjacent to the first set of LDMOS gates 118, to form a second set of LDMOS source regions 128 in the second p-type backgate region 112 adjacent to the second set of LDMOS gates 120, to form a first LDMOS backgate contact diffused region 130 in the first p-type backgate region 110 between the first set of LDMOS source regions 126, and to form a second LDMOS backgate contact diffused region 132 in the second p-type backgate region 112 between the second set of LDMOS source regions 128.

FIG. 1C depicts the three terminal bi-directional LDMOS of the instant embodiment including an interconnect network. A first metal silicide layer 134 is formed on a top surface of the first set of LDMOS source regions 126 and the first LDMOS backgate contact diffused region 130, and a second metal silicide layer 136 is formed on a top surface of the second set of LDMOS source regions 128 and the second LDMOS backgate contact diffused region 132, using known self-aligned metal silicide methods, such as depositing a layer of metal, for example, nickel, cobalt or titanium, on the top surface of the IC 100, heating the IC 100 to react the metal with exposed silicon on the top surface of the IC 100 to form a first phase of metal silicide, and selectively removing unreacted metal from the IC 100, commonly by exposing the IC 100 to wet etchants including hydrogen peroxide. An optional silicide anneal process may be performed to convert the metal silicide to a desired second phase. The first metal silicide layer 134 electrically connects the first set of LDMOS source regions 126 with the first LDMOS backgate contact diffused region 130 through a low resistance shunt, preferably less than 1 ohm. Similarly, the second metal silicide layer 136 electrically connects the second set of LDMOS source regions 128 with the second LDMOS backgate contact diffused region 132 through another low resistance shunt, also preferably less than 1 ohm.

The first set of LDMOS gates 118, the gate dielectric layer 116, the first p-type backgate region 110, the deep n-well 108, the first set of LDMOS source regions 126 and the first LDMOS backgate contact diffused region 130 collectively form a first uni-directional LDMOS transistor with its source node shorted to its backgate node. Similarly, the second set of LDMOS gates 120, the gate dielectric layer 116, the second p-type backgate region 112, the deep n-well 108, the second set of LDMOS source regions 128 and the second LDMOS backgate contact diffused region 132 collectively form a second uni-directional LDMOS transistor with its source node shorted to its backgate node. The first and second uni-directional LDMOS transistors are connected in series and share a common drain node in the deep n-well 108.

Continuing to refer to FIG. 1C, a first source/drain terminal 138 of the three terminal bi-directional LDMOS is electrically connected to the first metal silicide layer 134, preferably by metal interconnects of the IC 100, depicted schematically by a first source/drain lead 140. Similarly, a second source/drain terminal 142 of the three terminal bi-directional LDMOS is electrically connected to the second metal silicide layer 136, preferably by metal interconnects of the IC 100, depicted schematically by a second source/drain lead 144. The first set of LDMOS gates 118 are electrically connected together, depicted schematically by a first gate connecting lead 146. Similarly, the second set of LDMOS gates 120 are electrically connected together, depicted schematically by a second gate connecting lead 148. The gate connecting leads 146, 148 may be metal interconnects of the IC 100, may be one or more LDMOS gate elements out of the plane of FIG. 1C, or may be another form of electrical connection.

Still referring to FIG. 1C, the first source/drain lead 140 is electrically connected to the first gate connecting lead 146 through a first gate clamp circuit 150, depicted schematically in FIG. 1C. Similarly, the second source/drain lead 144 is electrically connected to the second gate connecting lead 148 through a second gate clamp circuit 152, also depicted schematically in FIG. 1C. Examples of the first gate clamp circuit 150 and the second gate clamp circuit 152 will be discussed hereinbelow.

Continuing to refer to FIG. 1C, a gate terminal 154 of the three terminal bi-directional LDMOS is electrically connected to the first gate connecting lead 146 through a first gate blocking diode 156, and is electrically connected to the second gate connecting lead 148 through a second gate blocking diode 158, depicted schematically by a gate terminal lead 160. The first gate blocking diode 156 is configured such that its anode is connected to the gate terminal 154 and its cathode is connected to the first gate connecting lead 146. Similarly, the second gate blocking diode 158 is configured such that its anode is connected to the gate terminal 154 and its cathode is connected to the second gate connecting lead 148.

Those familiar with LDMOS transistors will recognize that the three terminal bi-directional LDMOS described in reference to FIG. 1C is symmetric with respect to the gate terminal 154 and the source/drain terminals 138, 142.

During operation of the three terminal bi-directional LDMOS described in reference to FIG. 1C, a ground potential is applied to the p-type material 104 in the substrate 102. A source potential, higher than, or substantially equal to, the ground potential, but less than a breakdown potential of the gate dielectric layer 116 is applied to the second source/drain terminal 142. A drain potential, higher than the source potential, but less than a breakdown potential of the deep n-well 108 to the p-type material 104 in the substrate 102, is applied to the first source/drain terminal 138. Due to the direct electrical connection between the first set of LDMOS source regions 126 and the first LDMOS backgate contact diffused region 130, the drain potential is applied to the first p-type backgate region 110, which forward biases a p-n junction between the first p-type backgate region 110 and the deep n-well 108, so that the deep n-well 108 is biased to the drain potential minus a forward bias voltage of the p-n junction.

A gate potential substantially equal to the source potential is applied to the gate terminal 154. The first gate clamp circuit 150 operates so as to maintain a potential difference between the first set of LDMOS gates 118 and the first p-type backgate region 110 less than the breakdown potential of the gate dielectric layer 116. The first gate blocking diode 156 reduces current between the first gate connecting lead 146 and the gate terminal lead 160 to an acceptable level.

The gate potential is transferred through the second gate blocking diode 158 to the first gate connecting lead 148, causing an accumulation layer to form in the second p-type backgate region 112 immediately below the second set of LDMOS gates 120, preventing any substantial current flow between the deep n-well 108 and the second set of LDMOS source regions 128. Thus, when the gate potential is substantially equal to the source potential, substantially no current flows between the first source/drain terminal 138 and the second source/drain terminal 142.

The gate potential is increased to a level sufficient to form an inversion layer in the second p-type backgate region immediately below the second set of LDMOS gates 120, but less than the breakdown potential of the gate dielectric layer 116. The inversion layer conducts current from the n-well 108 to the second set of LDMOS source regions 128. Thus, when the gate potential is raised to a level common known as an on-state voltage, current flows between the first source/drain terminal 138 and the second source/drain terminal 142.

Those familiar with LDMOS transistors will recognize that the symmetry of the three terminal bi-directional LDMOS enables the same functionality described above when the source and drain potentials are reversed, thus providing bi-directional operation.

Figure 2A:
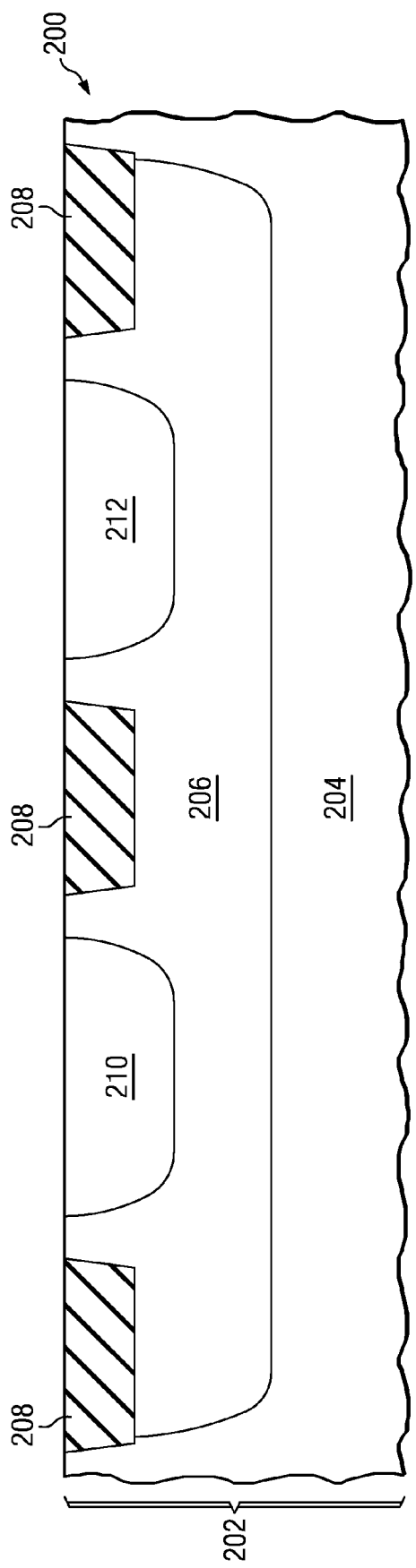
FIG. 2A through FIG. 2C are cross-sections of a second embodiment of the instant invention depicted in successive stages of fabrication.
Figure 2B:
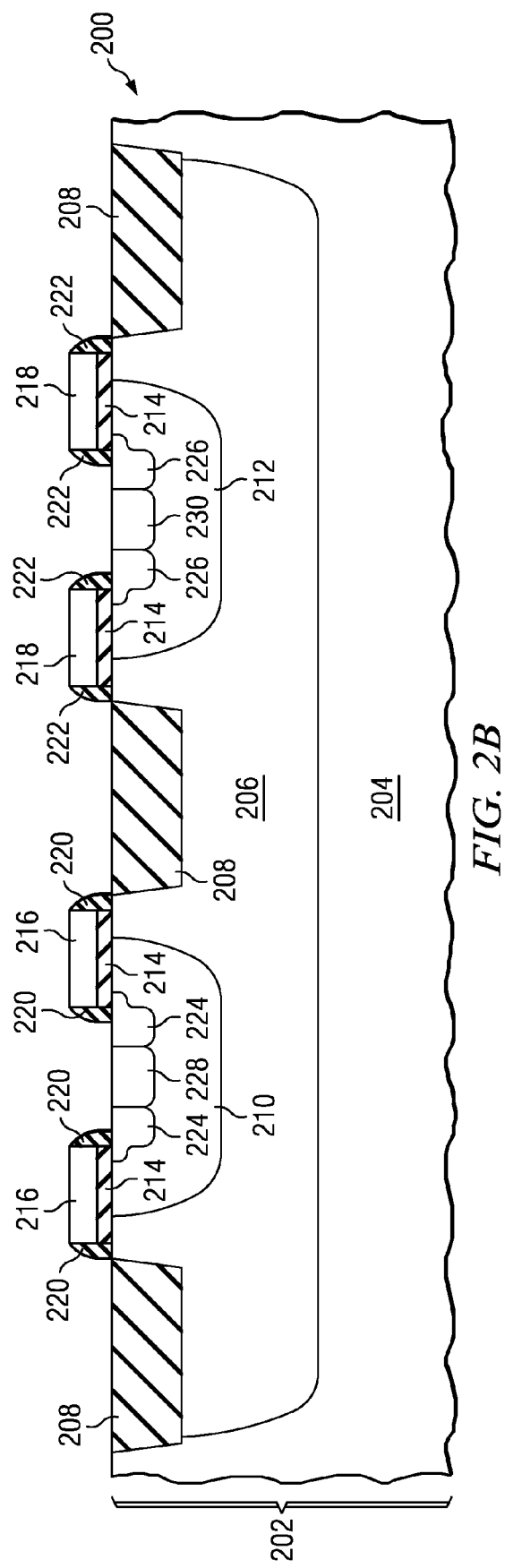
Figure 2C:
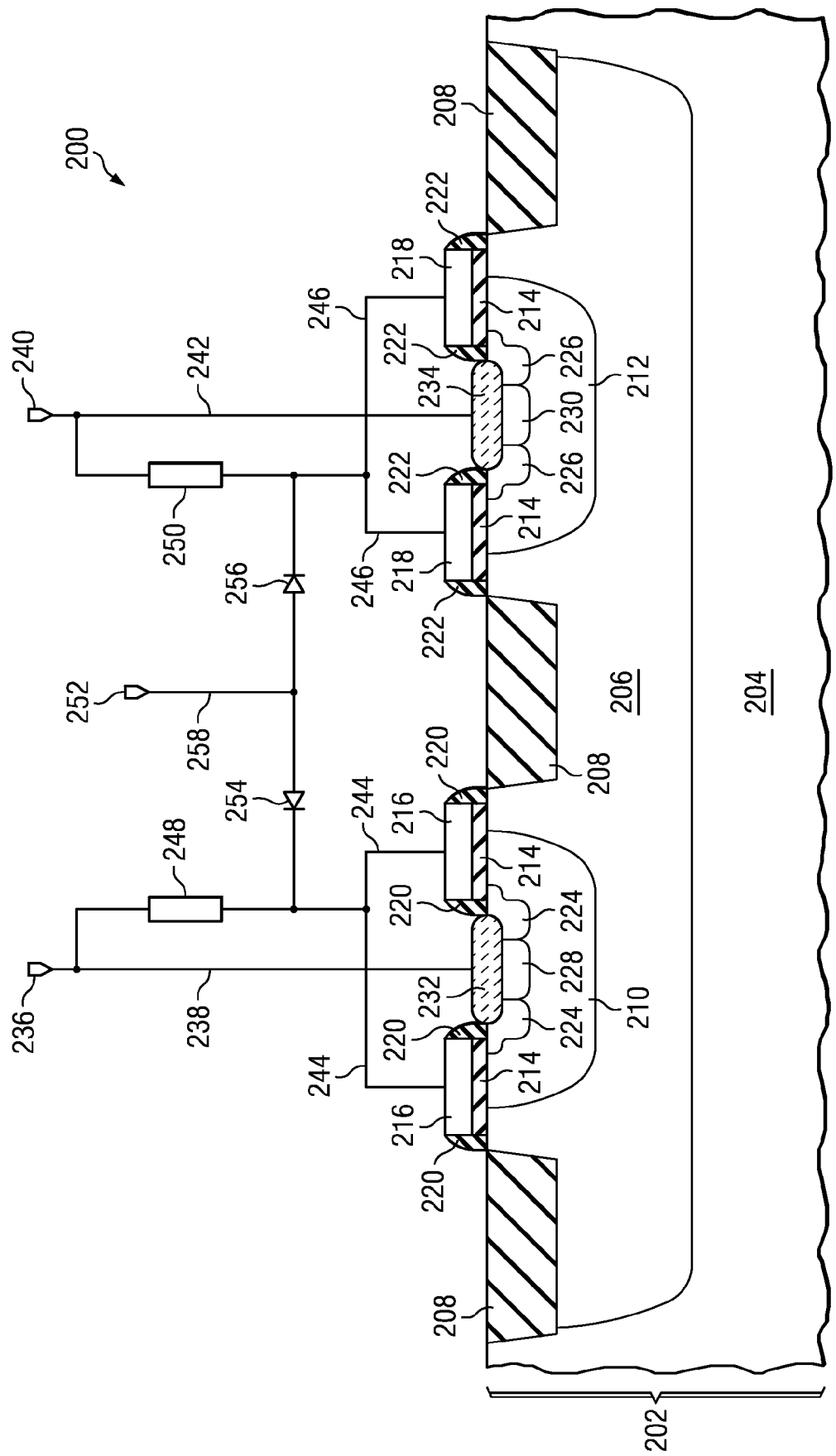

FIG. 2A through FIG. 2C are cross-sections of a second embodiment of the instant invention depicted in successive stages of fabrication. Referring to FIG. 2A, an IC 200 is formed in a substrate 202 with the properties described in reference to FIG. 1A. Substrate material 204 near a top surface of the substrate 202 is p-type. A deep n-well 206 is formed in the substrate 202, by processes described in reference to FIG. 1A, extending from the top surface of the substrate 202 to a depth between 2 and 5 microns. Optional elements of field oxide 208 are formed by STI processes, as described in reference to FIG. 1A, to isolate elements of the three terminal bi-directional LDMOS.

Still referring to FIG. 2A, a first p-type backgate well 210 and a second p-type backgate well 212 are formed in the deep n-well 206, using known methods, for example ion implanting a p-well set of p-type dopants, typically boron, at a total dose between $1 \cdot 10^{13}$ and $3 \cdot 10^{14}$ cm$^{-2}$, into areas of the deep n-well 206 defined for the two backgate wells 210, 212, and annealing the IC 200 to diffuse and activate a portion of the p-well set of dopants to provide p-type backgate wells 210, 212 extending from the top surface of the n-well 206 to a depth between 300 and 800 nanometers. The two backgate wells 210, 212 are isolated from the p-type material 204 in the substrate 202 and from each other by the deep n-well 206.

FIG. 2B depicts the IC 200 at a subsequent stage of fabrication. A gate dielectric layer 214, as described in reference to FIG. 1B, is formed on top surfaces of the deep n-well 206, first p-type backgate well 210 and second p-type backgate well 212. A first set of LDMOS gates 216 is formed on a top surface of the gate dielectric layer 214 overlapping the deep n-well 206 and the first p-type backgate well 210. A second set of LDMOS gates 218 is formed on the top surface of the gate dielectric layer 214 overlapping the deep n-well 206 and the second p-type backgate region 212. The LDMOS gates 216, 218 are formed using known methods, as described in reference to FIG. 1B.

Continuing to refer to FIG. 2B, a set of NLDD set of n-type dopants is ion implanted into a top region of the first p-type backgate well 210 adjacent to the first set of LDMOS gates 216 and into a top region of the second p-type backgate well 212 adjacent to the second set of LDMOS gates 218, as described in reference to FIG. 1B. A first set of gate sidewall spacers 220 is formed on lateral surfaces of the first set of LDMOS gates 216, and a second set of gate sidewall spacers 222 is formed on lateral surfaces of the second set of LDMOS gates 218, using known methods, as described in reference to FIG. 1B. An NSD set of n-type dopants is ion implanted into the top region of the first p-type backgate well 210 adjacent to the first set of gate sidewall spacers 220 and into a top region of the second p-type backgate well 212 adjacent to the second set of gate sidewall spacers 222, using common NSD process parameters, as described in reference to FIG. 1B. The NSD implanted regions overlap the NLDD implanted regions.

Continuing to refer to FIG. 2B, a p-type tap set of p-type dopants is ion implanted into the top region of the first p-type backgate well 210 between the NSD implanted regions and into the top region of the second p-type backgate well 212 between the NSD implanted regions, using common n-type tap process parameters, as described in reference to FIG. 1B. An anneal operation is performed on the IC 200 which activates a portion of the NLDD set of dopants, a portion of the NSD set of dopants and a portion of the p-type tap set of dopants to form a first set of LDMOS source regions 224 in the first p-type backgate well 210 adjacent to the first set of LDMOS gates 216, to form a second set of LDMOS source regions 226 in the second p-type backgate well 212 adjacent to the second set of LDMOS gates 218, to form a first LDMOS backgate contact diffused region 228 in the first p-type backgate well 210 between the first set of LDMOS source regions 224, and to form a second LDMOS backgate contact diffused region 230 in the second p-type backgate well 212 between the second set of LDMOS source regions 226.

FIG. 2C depicts the three terminal bi-directional LDMOS of the instant embodiment including an interconnect network. A first metal silicide layer 232 is formed on a top surface of the first set of LDMOS source regions 224 and the first LDMOS backgate contact diffused region 228, and a second metal silicide layer 234 is formed on a top surface of the second set of LDMOS source regions 226 and the second LDMOS backgate contact diffused region 230, using known self-aligned metal silicide methods, as described in reference to FIG. 1C.

The first set of LDMOS gates 216, the gate dielectric layer 214, the first p-type backgate well 210, the deep n-well 206, the first set of LDMOS source regions 224 and the first LDMOS backgate contact diffused region 228 collectively form a first uni-directional LDMOS transistor with its source node shorted to its backgate node. Similarly, the second set of LDMOS gates 218, the gate dielectric layer 214, the second p-type backgate well 212, the deep n-well 206, the second set of LDMOS source regions 226 and the second LDMOS backgate contact diffused region 230 collectively form a second uni-directional LDMOS transistor with its source node shorted to its backgate node. The first and second uni-directional LDMOS transistors are connected in series and share a common drain node in the deep n-well 206.

Continuing to refer to FIG. 2C, an interconnect network similar to that described in reference to FIG. 1C is formed to connect elements of the instant embodiment, including a first source/drain terminal 236 electrically connected to the first metal silicide layer 232 by a first source/drain lead 238, a second source/drain terminal 240 electrically connected to the second metal silicide layer 234 by a second source/drain lead 242, a first gate connecting lead 244 electrically connecting the first set of LDMOS gates 216 together, a second gate connecting lead 246 electrically connecting the second set of LDMOS gates 218 together, a first gate clamp circuit 248 electrically connecting the first source/drain lead 238 to the first gate connecting lead 244, a second gate clamp circuit 250 electrically connecting the second source/drain lead 242 to the second gate connecting lead 246, and a gate terminal 252 electrically connected to the first gate connecting lead 244 through a first gate blocking diode 254, and electrically connected to the second gate connecting lead 246 through a second gate blocking diode 256 by a gate terminal lead 258.

Operation of the three terminal bi-directional LDMOS described in reference to FIG. 2C is substantially similar to operation of the three terminal bi-directional LDMOS formed according to the first embodiment, as described in reference to FIG. 1C.

Figure 3C:
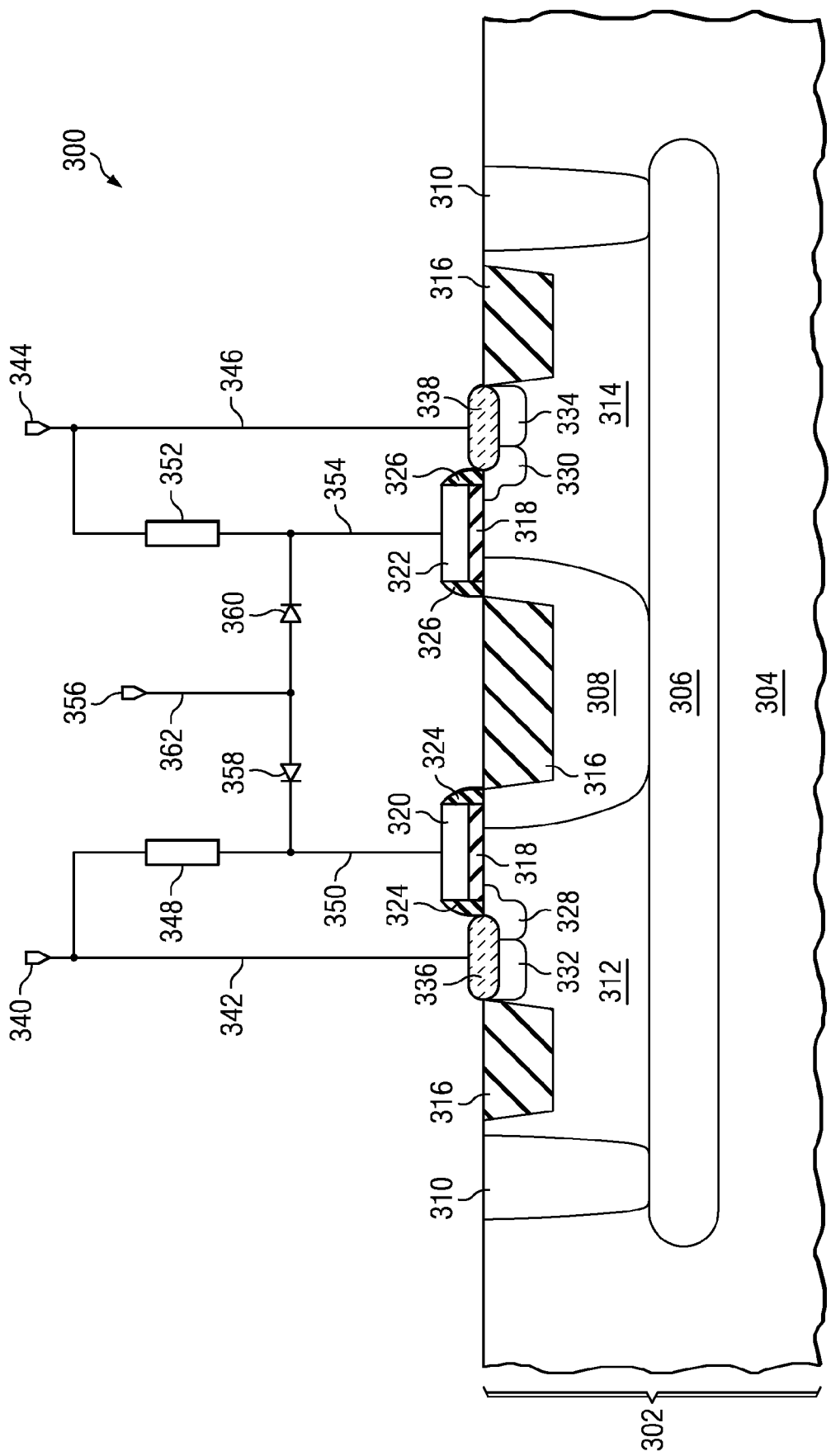

FIG. 3A through FIG. 3C are cross-sections of a third embodiment of the instant invention depicted in successive stages of fabrication. Referring to FIG. 3A, an IC 300 is formed in a substrate 302 with the properties described in reference to FIG. 1A. Substrate material 304 near a top surface of the substrate 302 is p-type. An NBL 306 is formed in the substrate in an area defined for the bi-directional LDMOS transistor using known methods, as described in reference to FIG. 1A, followed by epitaxial growth of 2 to 5 microns of p-type semiconductor material on a top surface of the substrate 302 and NBL 306. A deep n-well 308 is formed in the substrate 302 in a drain area of the three terminal bi-directional LDMOS, by processes described in reference to FIG. 1A, extending from the top surface of the substrate 302 to the NBL 306. Deep n-type diffused regions known a n-sinkers 310 are formed in the substrate 302 around the area defined for the bi-directional LDMOS transistor, extending from the top surface of the substrate 302 to the NBL 306, so as to electrically isolate two regions of p-type substrate material from remaining p-type substrate material 304, forming a first p-type backgate region 312 and a second p-type backgate region 314. The deep n-well 306 electrically isolates the first p-type backgate region 312 from the second p-type backgate region 314. Optional elements of field oxide 316 are formed by STI processes, as described in reference to FIG. 1A, to isolate elements of the three terminal bi-directional LDMOS.

FIG. 3B depicts the IC 300 at a subsequent stage of fabrication. A gate dielectric layer 318, as described in reference to FIG. 1B, is formed on top surfaces of the deep n-well 308, first p-type backgate well 312 and second p-type backgate well 314. A first LDMOS gate 320 is formed on a top surface of the gate dielectric layer 318 overlapping the deep n-well 306 and the first p-type backgate well 312. A second LDMOS gate 322 is formed on the top surface of the gate dielectric layer 318 overlapping the deep n-well 306 and the second p-type backgate region 314. The LDMOS gates 320, 322 are formed using known methods, as described in reference to FIG. 1B.

Continuing to refer to FIG. 3B, a set of NLDD set of n-type dopants is ion implanted into a top region of the first p-type backgate region 312 adjacent to the first LDMOS gate 320 and into a top region of the second p-type backgate region 314 adjacent to the second LDMOS gate 322, as described in reference to FIG. 1B. A first set of gate sidewall spacers 324 is formed on lateral surfaces of the first LDMOS gate 320, and a second set of gate sidewall spacers 326 is formed on lateral surfaces of the second LDMOS gate 322, using known methods, as described in reference to FIG. 1B. An NSD set of n-type dopants is ion implanted into the top region of the first p-type backgate region 312 adjacent to the first set of gate sidewall spacers 324 and into a top region of the second p-type backgate region 212 adjacent to the second set of gate sidewall spacers 326, using common NSD process parameters, as described in reference to FIG. 1B. The NSD implanted regions overlap the NLDD implanted regions. A p-type tap set of p-type dopants is ion implanted into the top region of the first p-type backgate region 312 adjacent to the NSD implanted region and into the top region of the second p-type backgate region 314 adjacent to the NSD implanted region, using common n-type tap process parameters, as described in reference to FIG. 1B. An anneal operation is performed on the IC 300 which activates a portion of the NLDD set of dopants, a portion of the NSD set of dopants and a portion of the p-type tap set of dopants to form a first LDMOS source region 328 in the first p-type backgate region 312 adjacent to the first LDMOS gate 320, to form a second LDMOS source region 330 in the second p-type backgate region 314 adjacent to the second LDMOS gate 322, to form a first LDMOS backgate contact diffused region 332 in the first p-type backgate region 312 adjacent to the first LDMOS source region 328, and to form a second LDMOS backgate contact diffused region 334 in the second p-type backgate region 314 adjacent to the second LDMOS source region 330.

FIG. 3C depicts the three terminal bi-directional LDMOS of the instant embodiment including an interconnect network. A first metal silicide layer 336 is formed on a top surface of the first LDMOS source region 328 and the first LDMOS backgate contact diffused region 332, and a second metal silicide layer 338 is formed on a top surface of the second LDMOS source region 330 and the second LDMOS backgate contact diffused region 334, using known self-aligned metal silicide methods, as described in reference to FIG. 1C.

The first LDMOS gate 320, the gate dielectric layer 318, the first p-type backgate region 312, the deep n-well 308, the first LDMOS source region 328 and the first LDMOS backgate contact diffused region 332 collectively form a first uni-directional LDMOS transistor with its source node shorted to its backgate node. Similarly, the second LDMOS gate 322, the gate dielectric layer 318, the second p-type backgate region 314, the deep n-well 308, the second LDMOS source region 330 and the second LDMOS backgate contact diffused region 334 collectively form a second uni-directional LDMOS transistor with its source node shorted to its backgate node. The first and second uni-directional LDMOS transistors are connected in series and share a common drain node in the deep n-well 308.

Continuing to refer to FIG. 3C, an interconnect network similar to that described in reference to FIG. 1C is formed to connect elements of the instant embodiment, including a first source/drain terminal 340 electrically connected to the first metal silicide layer 336 by a first source/drain lead 342, a second source/drain terminal 344 electrically connected to the second metal silicide layer 338 by a second source/drain lead 346, a first gate clamp circuit 348 electrically connecting the first source/drain lead 342 to the first LDMOS gate 320 through a first gate connecting lead 350, a second gate clamp circuit 352 electrically connecting the second source/drain lead 346 to the second LDMOS gate 322 through a second gate connecting lead 354, and a gate terminal 356 electrically connected to the first gate connecting lead 350 through a first gate blocking diode 358, and electrically connected to the second gate connecting lead 354 through a second gate blocking diode 360 by a gate terminal lead 362.

Operation of the three terminal bi-directional LDMOS described in reference to FIG. 3C is substantially similar to operation of the three terminal bi-directional LDMOS formed according to the first embodiment, as described in reference to FIG. 1C.

Figure 4:
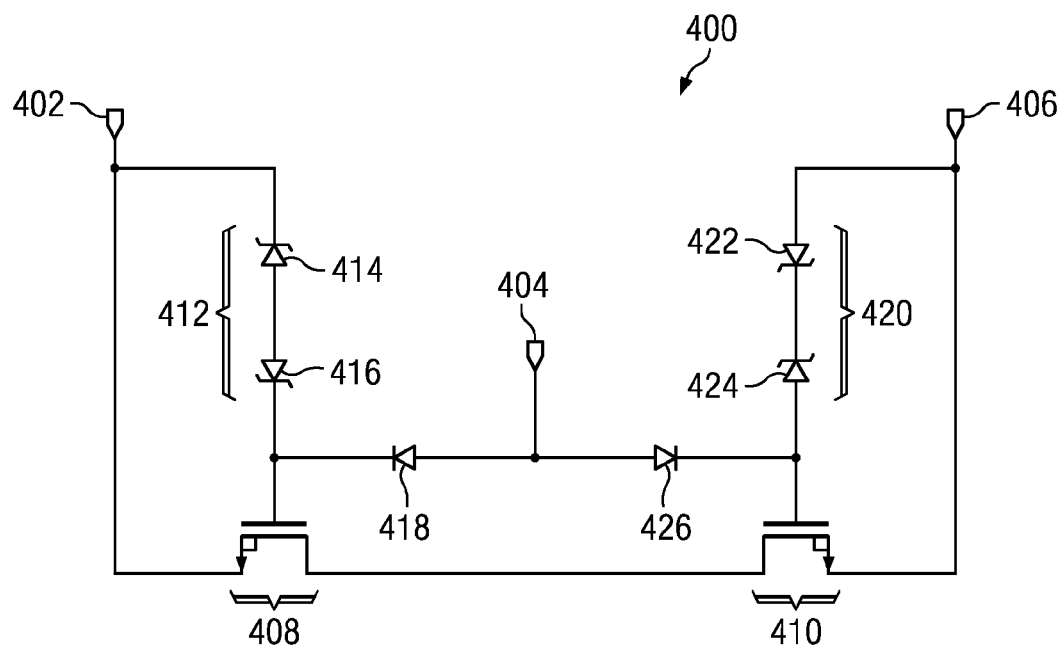
FIG. 4 is a schematic depiction of a first embodiment of an interconnect network in a three terminal bidirectional LDMOS formed according to the instant invention.

FIG. 4 is a schematic depiction of a first embodiment of an interconnect network in a three terminal bi-directional LDMOS formed according to the instant invention, in which the gate clamp circuits of FIG. 3 include zener diodes. The interconnect network 400 includes a first source/drain terminal 402, a gate terminal 404 and a second source/drain terminal 406. A first uni-directional LDMOS transistor 408 of the inventive three terminal bi-directional LDMOS and a second uni-directional LDMOS transistor 410 of the inventive three terminal bi-directional LDMOS are connected in series and share a common drain node.

Continuing to refer to FIG. 4, the first source/drain terminal 402 is connected to a gate node of the first uni-directional LDMOS transistor 408 through a first embodiment of a gate clamp circuit 412 which includes a first zener diode 414 in series with a second zener diode 416. In the first embodiment of the gate clamp circuit 412, a cathode of the first zener diode 414 is connected to the first source/drain terminal 402, an anode of the first zener diode 414 is connected to an anode of the second zener diode 416, and a cathode of the second zener diode 416 is connected to the gate node of the first uni-directional LDMOS transistor 408. A reverse breakdown voltage of the first zener diode 414 is less than a breakdown potential of a gate dielectric layer in the first uni-directional LDMOS transistor 408. Similarly, a reverse breakdown voltage of the second zener diode 416 is less than a breakdown potential of a gate dielectric layer in the first uni-directional LDMOS transistor 408.

Still referring to FIG. 4, the gate terminal 404 is connected to the gate node of the first uni-directional LDMOS transistor 408 through a first gate blocking diode 418. An anode of the first gate blocking diode 418 is connected to the gate terminal 404 and a cathode of the first gate blocking diode 418 is connected to the gate node of the first uni-directional LDMOS transistor 408. The first gate blocking diode 418 is formed such that its reverse breakdown voltage is greater than a breakdown potential between a drain node and a source node of the first uni-directional LDMOS transistor 408.

Continuing to refer to FIG. 4, the second source/drain terminal 406 is connected to a gate node of the second uni-directional LDMOS transistor 410 through a second embodiment of the gate clamp circuit 420 which includes a third zener diode 422 in series with a fourth zener diode 424. In the second embodiment of the gate clamp circuit 420, an anode of third zener diode 422 is connected to the second source/drain terminal 406, a cathode of the third zener diode 422 is connected to a cathode of the fourth zener diode 424, and an anode of the fourth zener diode 424 is connected to the gate node of the second uni-directional LDMOS transistor 410. A reverse breakdown voltage of the third zener diode 422 is less than a breakdown potential of a gate dielectric layer in the second uni-directional LDMOS transistor 410. Similarly, a reverse breakdown voltage of the fourth zener diode 424 is less than a breakdown potential of a gate dielectric layer in the second uni-directional LDMOS transistor 410.

Still referring to FIG. 4, the gate terminal 404 is connected to the gate node of the second uni-directional LDMOS transistor 410 through a second gate blocking diode 426. An anode of the second gate blocking diode 426 is connected to the gate terminal 404 and a cathode of the second gate blocking diode 426 is connected to the gate node of the second uni-directional LDMOS transistor 410. The second gate blocking diode 426 is formed such that its reverse breakdown voltage is greater than a breakdown potential between a drain node and a source node of the second uni-directional LDMOS transistor 410.

It will be recognized by those familiar with LDMOS transistors that a three terminal bi-directional LDMOS may be formed with two instances of the first embodiment of the gate clamp circuit, or with two instances of the second embodiment of the gate clamp circuit, or with an instance of the first embodiment and an instance of the second embodiment of the gate clamp circuit.

The first zener diode 414, the second zener diode 416, the first gate blocking diode 418, the third zener diode 422, the fourth zener diode 424, and the second gate blocking diode 426 may be formed in the IC containing the inventive three terminal bi-directional LDMOS using known methods of forming blocking diodes and zener diodes.

Figure 5:
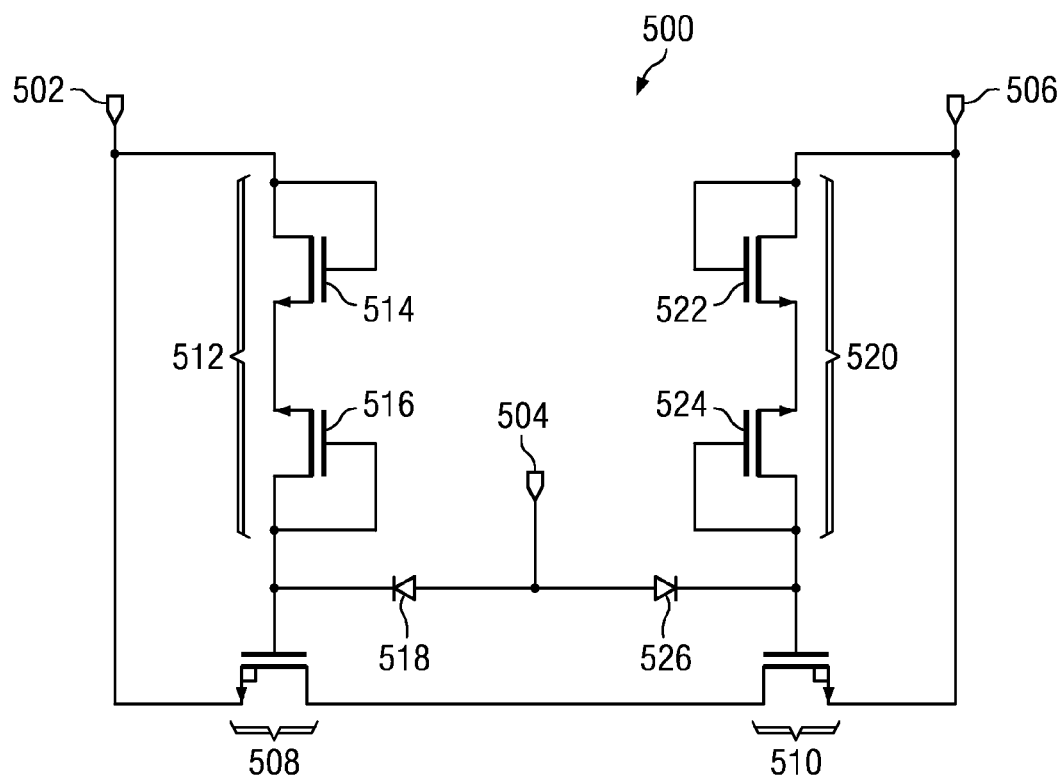
FIG. 5 is a schematic depiction of a second embodiment of an interconnect network in a three terminal bidirectional LDMOS formed according to the instant invention.

FIG. 5 is a schematic depiction of a second embodiment of an interconnect network in a three terminal bi-directional LDMOS formed according to the instant invention, in which the gate clamp circuits of FIG. 3 include MOS transistors. The interconnect network 500 includes a first source/drain terminal 502, a gate terminal 504 and a second source/drain terminal 506. A first uni-directional LDMOS transistor 508 of the inventive three terminal bi-directional LDMOS and a second uni-directional LDMOS transistor 510 of the inventive three terminal bi-directional LDMOS are connected in series and share a common drain node.

Continuing to refer to FIG. 5, the first source/drain terminal 502 is connected to a gate node of the first uni-directional LDMOS transistor 508 through a first instance of a third embodiment of a gate clamp circuit 512 which includes a first NMOS transistor 514 in series with a second NMOS transistor 516. In the first instance of the third embodiment of the gate clamp circuit 512, a drain node of the first NMOS transistor 514 is connected to the first source/drain terminal 502, a source node of the first NMOS transistor 514 is connected to a source node of the second NMOS transistor 516, a drain node of the second NMOS transistor 516 is connected to the gate node of the first uni-directional LDMOS transistor 508, a gate node of the first NMOS transistor 514 is connected to the first source/drain terminal 502, and a gate node of the second NMOS transistor 516 is connected to the gate node of the first uni-directional LDMOS transistor 508. A threshold voltage of the first NMOS transistor 514 is less than a breakdown potential of a gate dielectric layer in the first uni-directional LDMOS transistor 508. Similarly, a threshold voltage of the second NMOS transistor 516 is less than a breakdown potential of a gate dielectric layer in the first uni-directional LDMOS transistor 508.

Still referring to FIG. 5, the gate terminal 504 is connected to the gate node of the first uni-directional LDMOS transistor 508 through a first gate blocking diode 518. An anode of the first gate blocking diode 518 is connected to the gate terminal 504 and a cathode of the first gate blocking diode 518 is connected to the gate node of the first uni-directional LDMOS transistor 508. A reverse breakdown voltage of the first gate blocking diode 518 is greater than a breakdown potential between a drain node and a source node of the first uni-directional LDMOS transistor 508.

Continuing to refer to FIG. 5, the second source/drain terminal 506 is connected to a gate node of the second uni-directional LDMOS transistor 510 through a second instance of the third embodiment of a gate clamp circuit 520 which includes a third NMOS transistor 522 in series with a fourth NMOS transistor 524. In the second instance of the gate clamp circuit 520, a drain node of the third NMOS transistor 522 is connected to the second source/drain terminal 506, a source node of the third NMOS transistor 522 is connected to a source node of the fourth NMOS transistor 524, a drain node of the fourth NMOS transistor is connected to the gate node of the second uni-directional LDMOS transistor 510, a gate node of the third NMOS transistor 522 is connected to the second source/drain terminal 506, and a gate node of the fourth NMOS transistor 524 is connected to the gate node of the second uni-directional LDMOS transistor 510. A threshold voltage of the third NMOS transistor 522 is less than a breakdown potential of a gate dielectric layer in the second uni-directional LDMOS transistor 510. Similarly, a threshold voltage of the fourth NMOS transistor 524 is less than a breakdown potential of a gate dielectric layer in the second uni-directional LDMOS transistor 510.

Still referring to FIG. 5, the gate terminal 504 is connected to the gate node of the second uni-directional LDMOS transistor 510 through a second gate blocking diode 526. An anode of the second gate blocking diode 526 is connected to the gate terminal 504 and a cathode of the second gate blocking diode 526 is connected to the gate node of the second uni-directional LDMOS transistor 510. A reverse breakdown voltage of the second gate blocking diode 526 is greater than a breakdown potential between a drain node and a source node of the second uni-directional LDMOS transistor 510.

The third embodiment of the gate clamp circuit is advantageous for instances of the three terminal bi-directional LDMOS in which breakdown potentials of gate dielectric layers in constituent uni-directional LDMOS transistors are below 3 to 4 volts.

The first NMOS transistor 514, the second NMOS transistor 516, the first gate blocking diode 518, the second NMOS transistor 522, the fourth NMOS transistor 524, and the second gate blocking diode 526 may be formed in the IC containing the inventive three terminal bi-directional LDMOS using known methods of forming blocking diodes and NMOS transistors.

What is claimed is:

1. A three terminal bi-directional laterally diffused metal oxide semiconductor (LDMOS) transistor, comprising:
 a first uni-directional LDMOS transistor, further including:
   a first backgate region which is electrically isolated from a semiconductor substrate; and
   a first low resistance shunt which is electrically connected to said first backgate region and a source node of said first uni-directional LDMOS transistor;
 a second uni-directional LDMOS transistor, further including:
   a second backgate region which is electrically isolated from said semiconductor substrate and from said first backgate region; and
   a second low resistance shunt which is electrically connected to said second backgate region and a source node of said second uni-directional LDMOS transistor;

a common n-type drain node, of which a portion of said common n-type drain node forms a drain node of said first uni-directional LDMOS transistor and a portion of said common n-type drain node forms a drain node of said second uni-directional LDMOS transistor;

a first source/drain terminal of said three terminal bi-directional LDMOS transistor which is electrically connected to said source node of said first uni-directional LDMOS transistor;

a second source/drain terminal of said three terminal bi-directional LDMOS transistor which is electrically connected to said source node of said second uni-directional LDMOS transistor;

a first gate clamp circuit which is electrically connected to said first source/drain terminal and to a gate node of said first uni-directional LDMOS transistor;

a second gate clamp circuit which is electrically connected to said second source/drain terminal and to a gate node of said second uni-directional LDMOS transistor;

a first gate blocking diode which is electrically connected to a gate terminal of said three terminal bi-directional LDMOS transistor and to said gate node of said first uni-directional LDMOS transistor, wherein an anode of said first gate blocking diode is electrically connected to said gate terminal of said three terminal bi-directional LDMOS transistor and a cathode of said first gate blocking diode is electrically connected to said gate node of said first uni-directional LDMOS transistor; and a second gate blocking diode which is electrically connected to said gate terminal of said three terminal bi-directional LDMOS transistor and to said gate node of said first uni-directional LDMOS transistor, wherein an anode of said second gate blocking diode is electrically connected to said gate terminal of said three terminal bi-directional LDMOS transistor and a cathode of said second gate blocking diode is electrically connected to said gate node of said second uni-directional LDMOS transistor.

2. The three terminal bi-directional LDMOS transistor of claim 1, in which:

said first gate clamp circuit includes:
a first zener diode formed in said semiconductor substrate; and
a second zener diode formed in said semiconductor substrate;

said second gate clamp circuit includes:
a third zener diode formed in said semiconductor substrate; and
a fourth zener diode formed in said semiconductor substrate;

a cathode of said first zener diode is electrically connected to said first source/drain terminal;
an anode of said first zener diode is electrically connected to an anode of said second zener diode;
a cathode of said second zener diode is electrically connected to said gate node of said first uni-directional LDMOS transistor;
a cathode of said third zener diode is electrically connected to said second source/drain terminal;
an anode of said third zener diode is electrically connected to an anode of said fourth zener diode; and
a cathode of said fourth zener diode is electrically connected to said gate node of said second uni-directional LDMOS transistor.

3. The three terminal bi-directional LDMOS transistor of claim 1, in which:

said first gate clamp circuit includes:

a first zener diode formed in said semiconductor substrate; and
a second zener diode formed in said semiconductor substrate;

said second gate clamp circuit includes:
a third zener diode formed in said semiconductor substrate; and
a fourth zener diode formed in said semiconductor substrate;

an anode of said first zener diode is electrically connected to said first source/drain terminal;
a cathode of said first zener diode is electrically connected to a cathode of said second zener diode;
an anode of said second zener diode is electrically connected to said gate node of said first uni-directional LDMOS transistor;
an anode of said third zener diode is electrically connected to said second source/drain terminal;
a cathode of said third zener diode is electrically connected to a cathode of said fourth zener diode; and
an anode of said fourth zener diode is electrically connected to said gate node of said second uni-directional LDMOS transistor.

4. The three terminal bi-directional LDMOS transistor of claim 1, in which:

said first gate clamp circuit includes a first n-channel metal oxide semiconductor (NMOS) transistor and a second NMOS transistor formed in said semiconductor substrate;

said second gate clamp circuit includes a third NMOS transistor and a fourth NMOS transistor formed in said semiconductor substrate;

a drain node of said first NMOS transistor is electrically connected to said first source/drain terminal;
a source node of said first NMOS transistor is electrically connected to a source node of said second NMOS transistor;
a drain node of said second NMOS transistor is connected to said gate node of said first uni-directional LDMOS transistor;
a gate node of said first NMOS transistor is electrically connected to said first source/drain terminal;
a gate node of said second NMOS transistor is connected to said gate node of said first uni-directional LDMOS transistor;
a drain node of said third NMOS transistor is electrically connected to said second source/drain terminal;
a source node of said third NMOS transistor is electrically connected to a source node of said fourth NMOS transistor;
a drain node of said fourth NMOS transistor is connected to said gate node of said second uni-directional LDMOS transistor;
a gate node of said third NMOS transistor is electrically connected to said second source/drain terminal; and
a gate node of said fourth NMOS transistor is connected to said gate node of said second uni-directional LDMOS transistor.

5. The three terminal bi-directional LDMOS transistor of claim 1, in which said common drain node further includes:

an n-type buried layer (NBL) formed in said semiconductor substrate under said first backgate region and said second backgate region; and
a deep n-well formed in said semiconductor substrate surrounding said first backgate region and said second backgate region and extending to said NBL.

6. The three terminal bi-directional LDMOS transistor of claim 1, in which:
   said common drain node further includes a deep n-well formed in said semiconductor substrate;
   said first backgate region includes a first p-well formed in said deep n-well; and
   said second backgate region includes a second p-well formed in said deep n-well.

7. The three terminal bi-directional LDMOS transistor of claim 1, in which:
   said common drain node further includes:
      an NBL formed in said semiconductor substrate under said first backgate region and said second backgate region;
      a deep n-well formed in said semiconductor substrate between said first backgate region and said second backgate region and extending to said NBL; and
      an n-sinker region formed in said semiconductor substrate surrounding said first backgate region and said second backgate region and extending to said NBL.

8. An integrated circuit containing a three terminal bi-directional LDMOS transistor, comprising:
   provided a semiconductor substrate;
   a first uni-directional LDMOS transistor, further including:
      a first backgate region which is electrically isolated from said semiconductor substrate; and
      a first low resistance shunt which is electrically connected to said first backgate region and a source node of said first uni-directional LDMOS transistor;
   a second uni-directional LDMOS transistor, further including:
      a second backgate region which is electrically isolated from said semiconductor substrate and from said first backgate region; and
      a second low resistance shunt which is electrically connected to said second backgate region and a source node of said second uni-directional LDMOS transistor;
   a common n-type drain node, of which a portion of said common n-type drain node forms a drain node of said first uni-directional LDMOS transistor and a portion of said common n-type drain node forms a drain node of said second uni-directional LDMOS transistor;
   a first source/drain terminal of said three terminal bi-directional LDMOS transistor which is electrically connected to said source node of said first uni-directional LDMOS transistor;
   a second source/drain terminal of said three terminal bi-directional LDMOS transistor which is electrically connected to said source node of said second uni-directional LDMOS transistor;
   a first gate clamp circuit electrically which is connected to said first source/drain terminal and to a gate node of said first uni-directional LDMOS transistor;
   a second gate clamp circuit which is electrically connected to said second source/drain terminal and to a gate node of said second uni-directional LDMOS transistor;
   a first gate blocking diode which is electrically connected to a gate terminal of said three terminal bi-directional LDMOS transistor and to said gate node of said first uni-directional LDMOS transistor, wherein an anode of said first gate blocking diode is electrically connected to said gate terminal of said three terminal bi-directional LDMOS transistor and a cathode of said first gate blocking diode is electrically connected to said gate node of said first uni-directional LDMOS transistor; and
   a second gate blocking diode which is electrically connected to said gate terminal of said three terminal bi-directional LDMOS transistor and to said gate node of said first uni-directional LDMOS transistor, wherein an anode of said second gate blocking diode is electrically connected to said gate terminal of said three terminal bi-directional LDMOS transistor and a cathode of said second gate blocking diode is electrically connected to said gate node of said second uni-directional LDMOS transistor.

9. The integrated circuit of claim 8, in which:
   said first gate clamp circuit includes:
      a first zener diode formed in said semiconductor substrate; and
      a second zener diode formed in said semiconductor substrate;
   said second gate clamp circuit includes:
      a third zener diode formed in said semiconductor substrate; and
      a fourth zener diode formed in said semiconductor substrate;
   a cathode of said first zener diode is electrically connected to said first source/drain terminal;
   an anode of said first zener diode is electrically connected to an anode of said second zener diode;
   a cathode of said second zener diode is electrically connected to said gate node of said first uni-directional LDMOS transistor;
   a cathode of said third zener diode is electrically connected to said second source/drain terminal;
   an anode of said third zener diode is electrically connected to an anode of said fourth zener diode; and
   a cathode of said fourth zener diode is electrically connected to said gate node of said second uni-directional LDMOS transistor.

10. The integrated circuit of claim 8, in which:
    said first gate clamp circuit includes:
       a first zener diode formed in said semiconductor substrate; and
       a second zener diode formed in said semiconductor substrate;
    said second gate clamp circuit includes:
       a third zener diode formed in said semiconductor substrate; and
       a fourth zener diode formed in said semiconductor substrate;
    an anode of said first zener diode is electrically connected to said first source/drain terminal;
    a cathode of said first zener diode is electrically connected to a cathode of said second zener diode;
    an anode of said second zener diode is electrically connected to said gate node of said first uni-directional LDMOS transistor;
    an anode of said third zener diode is electrically connected to said second source/drain terminal;
    a cathode of said third zener diode is electrically connected to a cathode of said fourth zener diode; and
    an anode of said fourth zener diode is electrically connected to said gate node of said second uni-directional LDMOS transistor.

11. The integrated circuit of claim 8, in which:
    said first gate clamp circuit includes a first n-channel metal oxide semiconductor (NMOS) transistor and a second NMOS transistor formed in said semiconductor substrate;

said second gate clamp circuit includes a third NMOS transistor and a fourth NMOS transistor formed in said semiconductor substrate;
a drain node of said first NMOS transistor is electrically connected to said first source/drain terminal;
a source node of said first NMOS transistor is electrically connected to a source node of said second NMOS transistor;
a drain node of said second NMOS transistor is connected to said gate node of said first uni-directional LDMOS transistor;
a gate node of said first NMOS transistor is electrically connected to said first source/drain terminal;
a gate node of said second NMOS transistor is connected to said gate node of said first uni-directional LDMOS transistor;
a drain node of said third NMOS transistor is electrically connected to said second source/drain terminal;
a source node of said third NMOS transistor is electrically connected to a source node of said fourth NMOS transistor;
a drain node of said fourth NMOS transistor is connected to said gate node of said second uni-directional LDMOS transistor;
a gate node of said third NMOS transistor is electrically connected to said second source/drain terminal; and
a gate node of said fourth NMOS transistor is connected to said gate node of said second uni-directional LDMOS transistor.

12. The integrated circuit of claim 8, in which said common drain node further includes:
an n-type buried layer (NBL) formed in said semiconductor substrate under said first backgate region and said second backgate region; and
a deep n-well formed in said semiconductor substrate surrounding said first backgate region and said second backgate region and extending to said NBL.

13. The integrated circuit of claim 8, in which:
said common drain node further includes a deep n-well formed in said semiconductor substrate;
said first backgate region includes a first p-well formed in said deep n-well; and
said second backgate region includes a second p-well formed in said deep n-well.

14. The integrated circuit of claim 8, in which said common drain node further includes:
an NBL formed in said semiconductor substrate under said first backgate region and said second backgate region;
a deep n-well formed in said semiconductor substrate between said first backgate region and said second backgate region and extending to said NBL; and
an n-sinker region formed in said semiconductor substrate surrounding said first backgate region and said second backgate region and extending to said NBL.

15. A process of forming an integrated circuit containing a three terminal bi-directional LDMOS transistor, comprising the steps of:
providing a semiconductor substrate; and
forming a three terminal bi-directional LDMOS transistor, further including the steps of:
forming a first uni-directional LDMOS transistor, further including the steps of:
forming a first backgate region in a manner which electrically isolates said first backgate region from said semiconductor substrate; and
forming a first low resistance shunt which is electrically connected to said first backgate region and to a source node of said first uni-directional LDMOS transistor;
forming a second uni-directional LDMOS transistor, further including the steps of:
forming a second backgate region in a manner which electrically isolates second backgate region from said semiconductor substrate and from said first backgate region; and
forming a second low resistance shunt which is electrically connected to said second backgate region and to a source node of said second uni-directional LDMOS transistor;
forming a common n-type drain node, such that a portion of said common n-type drain node forms a drain node of said first uni-directional LDMOS transistor and a portion of said common n-type drain node forms a drain node of said second uni-directional LDMOS transistor;
forming a first source/drain terminal which is electrically connected to said source node of said first uni-directional LDMOS transistor;
forming a second source/drain terminal which is electrically connected to said source node of said second uni-directional LDMOS transistor;
forming a first gate clamp circuit which is electrically connected to said first source/drain terminal and to a gate node of said first uni-directional LDMOS transistor;
forming a second gate clamp circuit which is electrically connected to said second source/drain terminal and to a gate node of said second uni-directional LDMOS transistor;
forming a first gate blocking diode which is electrically connected to a gate terminal of said three terminal bi-directional LDMOS transistor and to said gate node of said first uni-directional LDMOS transistor, wherein an anode of said first gate blocking diode is electrically connected to said gate terminal of said three terminal bi-directional LDMOS transistor and a cathode of said first gate blocking diode is electrically connected to said gate node of said first uni-directional LDMOS transistor; and
forming a second gate blocking diode which is electrically connected to said gate terminal of said three terminal bi-directional LDMOS transistor and to said gate node of said first uni-directional LDMOS transistor, wherein an anode of said second gate blocking diode is electrically connected to said gate terminal of said three terminal bi-directional LDMOS transistor and a cathode of said second gate blocking diode is electrically connected to said gate node of said second uni-directional LDMOS transistor.

16. The process of claim 15, in which:
said step of forming a first gate clamp circuit further includes the steps of:
forming a first zener diode in said semiconductor substrate; and
forming a second zener diode in said semiconductor substrate;
said step of forming a second gate clamp circuit further includes the steps of:
forming a third zener diode in said semiconductor substrate; and
forming a fourth zener diode in said semiconductor substrate;

a cathode of said first zener diode is electrically connected to said first source/drain terminal;
an anode of said first zener diode is electrically connected to an anode of said second zener diode;
a cathode of said second zener diode is electrically connected to said gate node of said first uni-directional LDMOS transistor;
a cathode of said third zener diode is electrically connected to said second source/drain terminal;
an anode of said third zener diode is electrically connected to an anode of said fourth zener diode; and
a cathode of said fourth zener diode is electrically connected to said gate node of said second uni-directional LDMOS transistor.

17. The process of claim 15, in which:
said step of forming a first gate clamp circuit further includes the step of forming a first NMOS transistor and a second NMOS transistor in said semiconductor substrate;
said step of forming a second gate clamp circuit further includes the step of forming a third NMOS transistor and a fourth NMOS transistor formed in said semiconductor substrate;
a drain node of said first NMOS transistor is electrically connected to said first source/drain terminal;
a source node of said first NMOS transistor is electrically connected to a source node of said second NMOS transistor;
a drain node of said second NMOS transistor is connected to said gate node of said first uni-directional LDMOS transistor;
a gate node of said first NMOS transistor is electrically connected to said first source/drain terminal;
a gate node of said second NMOS transistor is connected to said gate node of said first uni-directional LDMOS transistor;
a drain node of said third NMOS transistor is electrically connected to said second source/drain terminal;
a source node of said third NMOS transistor is electrically connected to a source node of said fourth NMOS transistor;
a drain node of said fourth NMOS transistor is connected to said gate node of said second uni-directional LDMOS transistor;
a gate node of said third NMOS transistor is electrically connected to said second source/drain terminal; and
a gate node of said fourth NMOS transistor is connected to said gate node of said second uni-directional LDMOS transistor.

18. The process of claim 15, in which said step of forming a common drain node further includes the steps of:
forming an n-type buried layer (NBL) in said semiconductor substrate under said first backgate region and said second backgate region; and
forming a deep n-well in said semiconductor substrate surrounding said first backgate region and said second backgate region and extending to said NBL.

19. The process of claim 15, in which:
said step of forming a common drain node further includes the step of forming a deep n-well in said semiconductor substrate;
said step of forming a first backgate region further includes the step of forming a first p-well in said deep n-well; and
said step of forming a second backgate region further includes the step of forming a second p-well in said deep n-well.

20. The process of claim 15, in which said step of forming a common drain node further includes the steps of:
forming an NBL in said semiconductor substrate under said first backgate region and said second backgate region;
forming a deep n-well in said semiconductor substrate between said first backgate region and said second backgate region and extending to said NBL; and
forming an n-sinker region in said semiconductor substrate surrounding said first backgate region and said second backgate region and extending to said NBL.

* * * * *